(12) United States Patent
Uebbing

(10) Patent No.: US 6,636,540 B2
(45) Date of Patent: Oct. 21, 2003

(54) OPTICAL TURN FOR MONITORING LIGHT FROM A LASER

(75) Inventor: John J Uebbing, Palo Alto, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/021,617

(22) Filed: Oct. 30, 2001

(65) Prior Publication Data
US 2003/0081645 A1 May 1, 2003

(51) Int. Cl.[7] .................................................. H01S 3/04
(52) U.S. Cl. .......................................... 372/36; 372/50
(58) Field of Search ...................... 372/36, 50; 359/152; 369/112; 385/31

(56) References Cited
U.S. PATENT DOCUMENTS 5,726,962 A * 3/1998 Okada et al. ................ 369/112
5,781,676 A * 7/1998 Okada ........................... 385/31
5,835,517 A * 11/1998 Jayaraman et al. ........... 372/50
6,040,934 A * 3/2000 Ogusu et al. ................. 359/152

* cited by examiner

Primary Examiner—Paul Ip
Assistant Examiner—Tuan M Nguyen
(74) Attorney, Agent, or Firm—Jack H. Wu; Judy L. Shie

(57) ABSTRACT

The present invention is an optical turn used to the monitor the output of a light source such as a VCSEL. Light incoming to the optical turn is reflected off of a totally internally reflecting surface towards a window-mirror, where the light is partially routed to an output lens, and partially diverted to a monitor lens where the diverted light can be focused onto a monitoring device, such as a photo-diode. In an alternative embodiment of the present invention, the optical turn is modified to monitor an incoming light array. In another alternative embodiment, the optical turn monitors an incoming light array, and further includes a zigzag multiplexer that is used to carry out Coarse Wavelength Division Multiplexing (CWDM). CWDM is the combination of different wavelengths of light into one beam.

23 Claims, 11 Drawing Sheets

OPTICAL TURN FOR MONITORING LIGHT FROM A LASER

FIELD OF THE INVENTION

The invention is directed towards semiconductor laser optical devices and more specifically, towards devices used in the monitoring and redirecting of light from a semiconductor laser light source.

BACKGROUND OF THE INVENTION

Semiconductor lasers are used as components in many optical systems. A Vertical Cavity Surface Emitting Laser (VCSEL) is one type of semiconductor laser. A VCSEL is often the preferred light source in applications, since it can be manufactured using standard integrated circuit fabrication methods. However, the output power of a VCSEL changes with temperature and time as the VCSEL ages. To keep the output power steady, the VCSEL light output is monitored constantly. A portion of the VCSEL light output is typically diverted in a feedback loop onto a monitoring device, such as a photodiode. When the output power varies, the feedback circuitry adjusts the current in the VCSEL accordingly. A partially transmitting mirror, also known as a window-mirror, is commonly used to divert a portion of the VCSEL light output onto the photodiode.

To make a compact device and to reduce stray inductance, the circuitry that drives the VCSEL needs to be physically located near the VCSEL. If the photodiode is also located close to the VCSEL, the photodiode and driver circuitry can be combined into a single integrated circuit (IC) known as a monitor/driver IC. This arrangement is advantageous because it reduces the number of parts that need to be manufactured and assembled, saving both time and money. The distance between the light emitted from the VCSEL, and the light incident upon the photodiode, is indicative of how close the VCSEL and photodiode can be to each other.

A device frequently used in monitoring VCSEL light output is an Angled Window Can (AWC) 101, as shown in FIG. 1A. Ray tracings of the light paths are drawn in. For ease of explanation, reference will be made to these exemplary light rays rather than the entire beam itself. A window-mirror 103 is supported by an outer shell 104 and positioned at an angle to an optical axis 106 of a VCSEL 105. The window-mirror 103 transmits a portion of the light from the VCSEL 105 as transmitted light rays 107, and diverts a portion of the light as monitored light rays 109 onto a photodiode 111. The monitoring of the VCSEL 105 is most effective when all of the monitored light rays 109 are detected. However, the monitored light rays 109 are not focused and spread over a wide area, requiring a photodiode 111 with a large surface area to detect all of the monitored light rays 109. The larger the surface area needed, the more expensive will be the photodiode 111. Additionally, to optically couple a fiber-optic cable (not shown) to the transmitted light rays 107 of the AWC, the fiber-optic cable must be mounted perpendicular to the plane of the VCSEL 105 and photodiode 111. This configuration results in a bulky package awkward to assemble and use in optical systems.

FIG. 1B shows an optical monitor 113 made by Tyco Electronics, with simple light tracings included. Optical monitor 113 is used in transceivers such as Tyco Electronics' product #1382345-1. Optical monitor 113 has an input lens 117 that collimates light from a VCSEL 116. A totally internally reflecting surface 115 reflects the collimated light towards a window-mirror 119. The window-mirror 119 partially transmits the light towards an output lens 123. The window-mirror 119 also partially reflects the light back at the totally internally reflecting surface 115, which reflects the light towards a monitor lens 121. The monitor lens 121 then focuses the light onto a photodiode 122. However, the light reflected by the window-mirror 119 reflects at a relatively large angle A125. Therefore, light path 127 onto the photodiode 122 is relatively far from light path 129 from the VCSEL 116—too far for the photodiode 122 to be integrated with the VCSEL driver into a single monitor/driver IC. Another drawback to the prior art optical monitor 113 is that it is not easily adaptable for parallel optics or Coarse Wavelength Division Multiplexing (CWDM). Furthermore, all of the optical components in this optical monitor 113 are surrounded by air. As the light travels through the air and the optical components, optical power is lost through Fresnel reflections. Fresnel reflections are caused when light travels between materials having different refractive indices.

Accordingly, there remains a need for an optical monitor that can monitor the light output from a VCSEL with a relatively small photodiode, to minimize the cost of the photodiode. Additionally, the optical monitor should have a low profile that keeps the VCSEL and photodiode on a plane parallel to the fiber-optic cable for easy assembly. Preferably, the distance between the light path from the VCSEL and the light path onto the photodiode is relatively small, which will allow the VCSEL driver and photodiode to be combined into a single monitor/driver IC. Fresnel reflections should also be kept to a minimum so as to minimize reflective optical power loss. Furthermore, the optical monitor should be easily adapted for use with parallel optics or CWDM.

SUMMARY OF THE INVENTION

In accordance with an aspect of the present invention, an optical device has input, output, and monitor lenses; a reflective surface; and a window-mirror. The device is preferably contained within an optically transmissive block made of moldable plastic, and the reflective surface is preferably a totally internally reflecting surface of the optically transmissive block. Incoming light from a light source is collimated by the input lens, reflected off of the totally internally reflecting surface, and then split by the window-mirror into partially reflected and partially transmitted light. The partially reflected light passes through the monitor lens to be focused onto a photodiode. Since the monitor lens can focus light onto a small area, a relatively small photodiode can be used, which results in a cost savings over the AWC. The partially transmitted light continues through the output lens to be focused onto a desired location. The internally reflecting surface and the window-mirror are angled such that the collimated incoming light and the partially reflected light have paths substantially parallel to each other. This allows the light source and the photodiode to be placed close together, and allows the photodiode to be integrated into a monitor/driver IC.

In a preferred embodiment, the window-mirror and lenses have substantially the same refractive index as the plastic to minimize reflective optical power loss from Fresnel reflections. The lenses can be molded from the same plastic as the optically transmissive block. Since the output light "turns" and exits at an angle from the input light, this optical device shall hereinafter be called an optical turn. The output light turns at a right angle to the input light, which allows the light source and the photodiode to be assembled on a plane parallel to the fiber-optic cable. By keeping the light source and photodiode on a plane parallel to the fiber-optic cable, the light source, photodiode, and optical turn can be assembled into a package that is compact and has a low profile.

In an alternate embodiment, the optical turn is adapted for parallel optics and monitors a light array. An input lens array, monitor lens array, and output lens array are used in place of the input lens, monitor lens, and output lens.

In another embodiment, the optical turn monitors a light array and further includes a zigzag multiplexer. This embodiment of the optical turn is used to carry out CWDM, the combination of several light beams with different wavelengths into one light beam that can be transmitted as one signal.

Further features and advantages of the present invention, as well as the structure and operation of preferred embodiments of the present invention, are described in detail below with reference to the accompanying exemplary drawings. In the drawings, like reference numbers indicate identical or functionally similar elements.

DETAILED DESCRIPTION

The present invention is an optical turn used to the monitor the output of a light source such as a VCSEL. Incoming light to the optical turn is partially routed to an output lens where an optical fiber can be connected, and partially diverted to a monitor lens where the power level of the output light can be monitored.

Figure 1A:
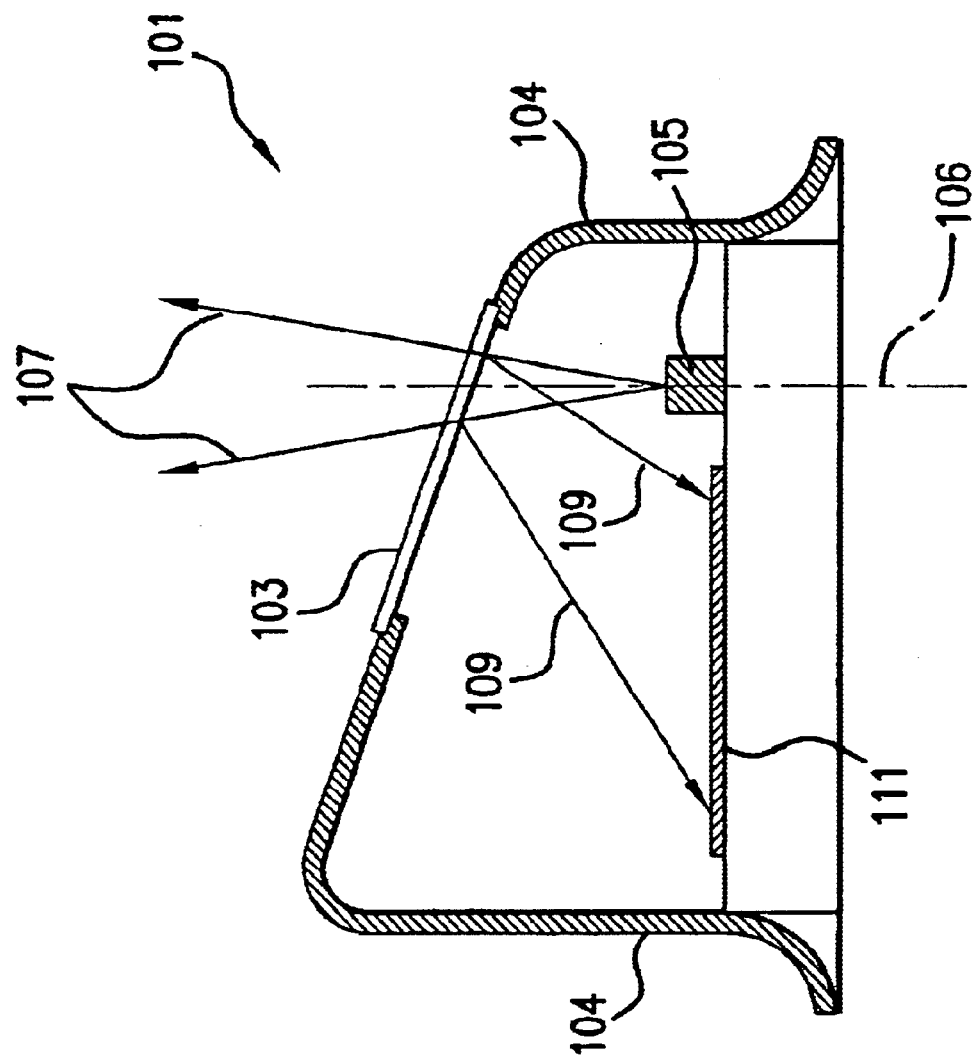
FIG. 1A is a cross-sectional view of an Angled Window Can from prior art.
Figure 1B:
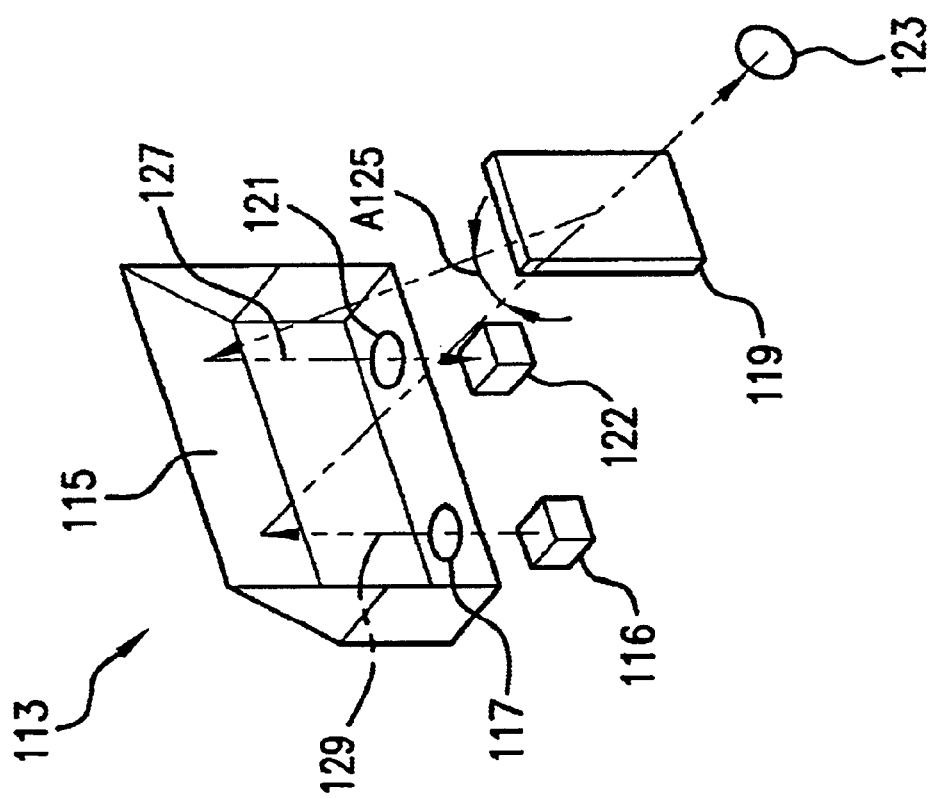
FIG. 1B is Tyco Electronics' optical monitor from prior art.
Figure 2A:
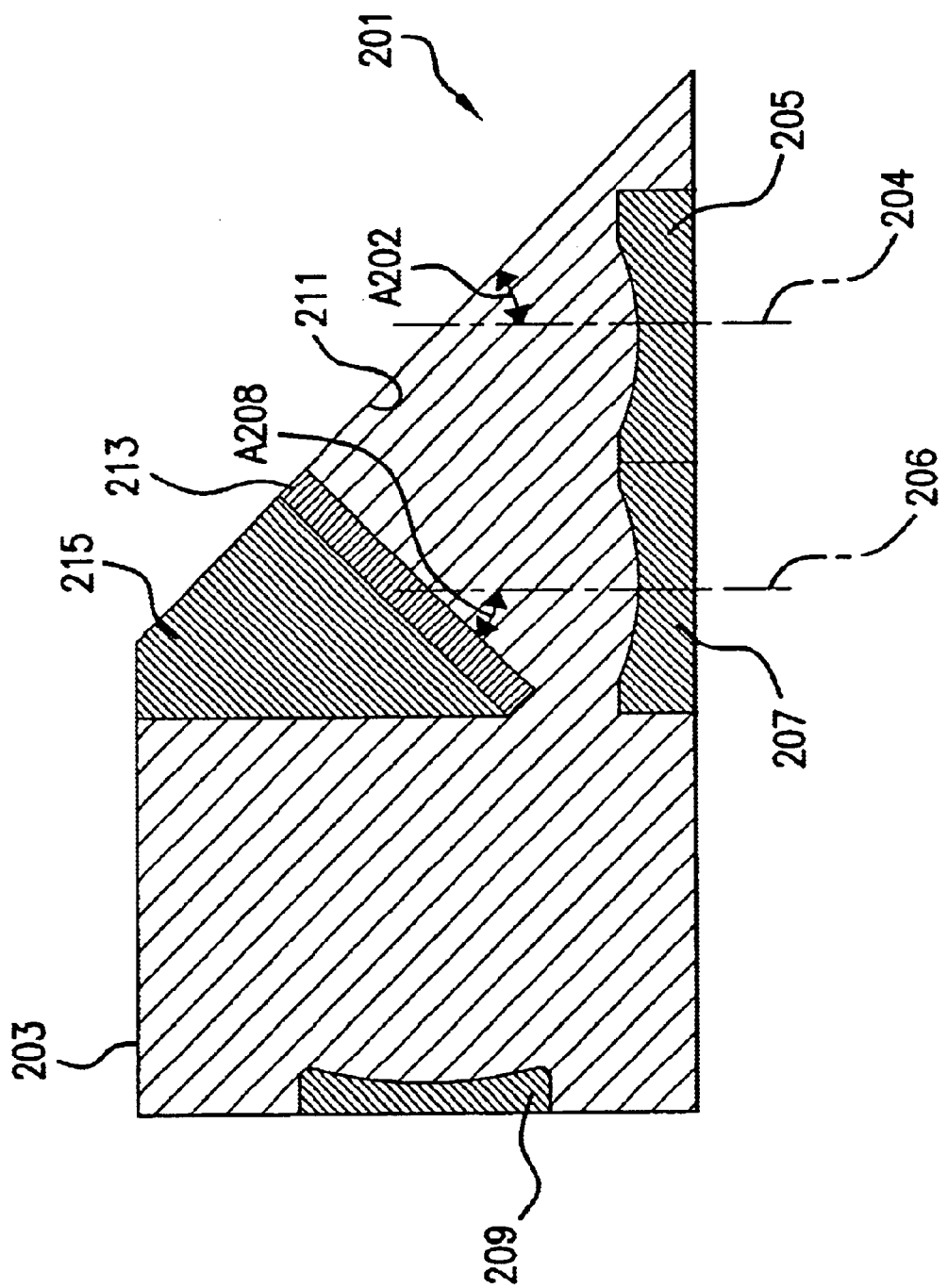
FIG. 2A is a cross-sectional view of a preferred embodiment of an optical turn.

FIG. 2A is a cross-sectional view of a preferred embodiment of an optical turn 201, made in accordance with the teachings of the present invention. The optical turn 201 consists of a solid block 203 with an input lens 205, monitor lens 207, and output lens 209. The solid block 203 is made of any optically transmissive plastic, preferably moldable plastic such as Ultem® from General Electric Company. The input lens 205, monitor lens 207, and output lens 209 are molded into the solid block 203, preferably formed from the same material as the solid block 203.

A totally internally reflecting (TIR) surface 211 of the solid block 203 is at an angle A202 to an optical axis 204 of the input lens 205. Any light entering the solid block 203 through the input lens 205 and striking the TIR surface 211 will be internally reflected because the angle of incidence is greater than the critical angle. A window-mirror 213 is positioned at an angle A208 to an optical axis 206 of the monitor lens 207. In a preferred embodiment, A202 is about 45 degrees and A208 is about 45 degrees. The window-mirror 213 is a partially reflecting, partially transmitting surface well-known in the art. The solid block 203 has a notch shaped to fit the window-mirror 213. The window-mirror 213 is placed in this notch and attached to the solid block 203 using any clear adhesive that is index-matched to the solid block 203. A plug 215 is then placed on top of the window-mirror 213 to fill in the notch. The plug 215 is fixed in place using an index-matched clear adhesive or an optical gel. In another embodiment, a more sophisticated mold can be used to form solid block 203 such that an empty slot is formed within the solid block 203, the empty slot shaped to fit the window-mirror 213. The window-mirror 213 can then be slipped into place in the empty slot after the solid block 203 is formed. For optimal performance, the solid block 203, window-mirror 213, plug 215, input lens 205, monitor lens 207, and output lens 209 should all have substantially the same index of refraction.

Figure 2B:
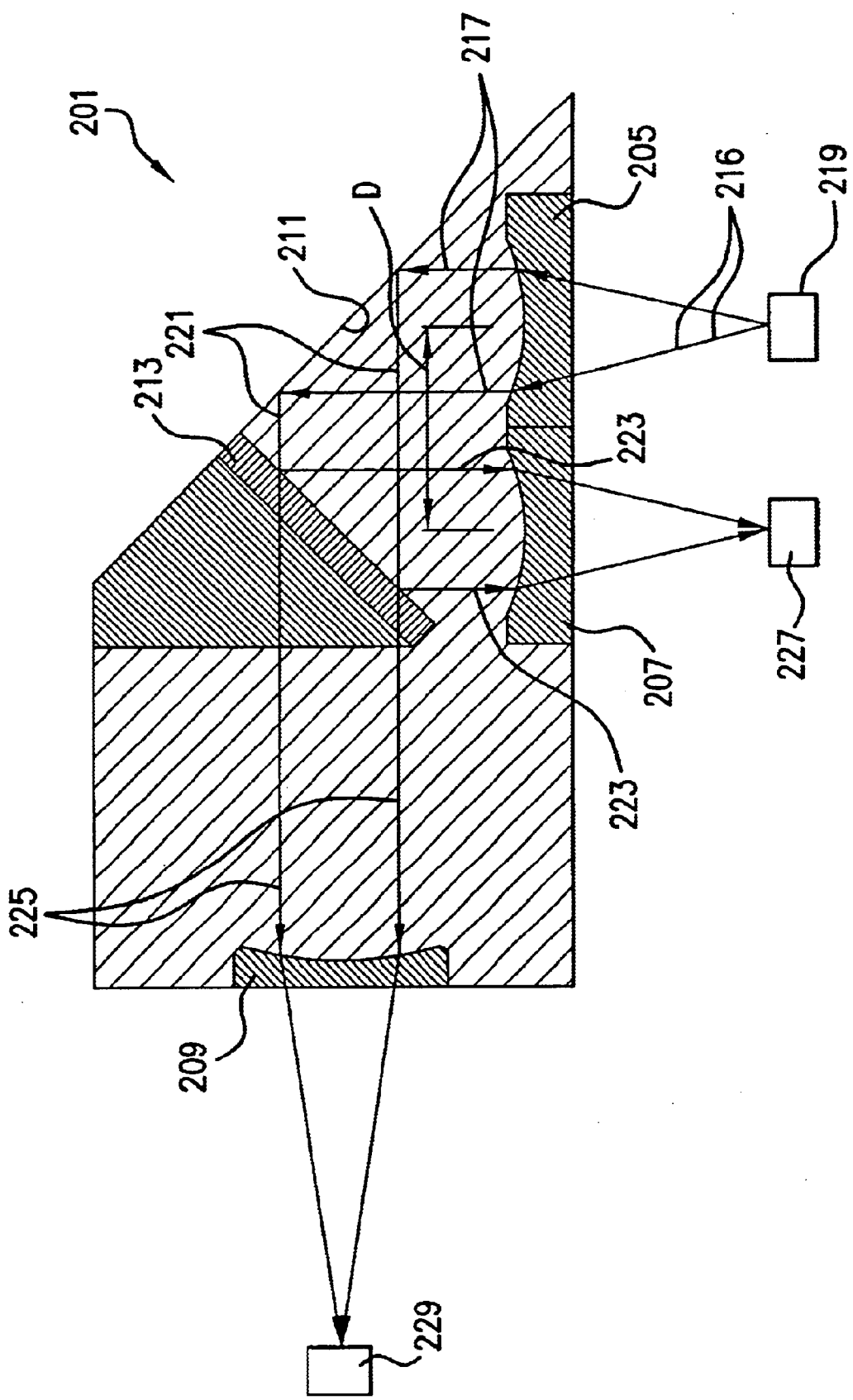
FIG. 2B is a cross-sectional view of a preferred embodiment of an optical turn with ray tracings. The customary cross-sectional indicators of transparent material have been left out to maintain clarity in the figure.

FIG. 2B illustrates the optical turn 201 of FIG. 2A, with ray tracings of the light path shown. Incoming light rays 216 enter the input lens 205 from a light source 219 such as a VCSEL. The input lens 205 collimates the incoming light rays 216 into collimated light rays 217. The collimated light rays 217 then reflect off of the TIR surface 211 at a right angle as reflected light rays 221. The reflected light rays 221 continue to the window-mirror 213, where they are partially reflected at a 90 degree angle as monitored light rays 223, and partially transmitted as transmitted light rays 225. The monitored light rays 223 pass through the monitor lens 207, where they are focused onto a monitoring device 227 such as a photodiode. Since all reflections occur at right angles, the paths of the collimated light rays 217 and the monitored light rays 223 are parallel to each other. The distance, D, between the collimated light rays 217 and the monitored light rays 223 is therefore smaller than if the two light paths were angled away from each other. This minimizes the distance between the light source 219 and the monitoring device 227, allowing integration of the monitoring device 227 into a monitor/driver IC. The transmitted light rays 225 continue to the output lens 209, where they are focused onto a desired location 229, such as an optical fiber.

Figure 2C:
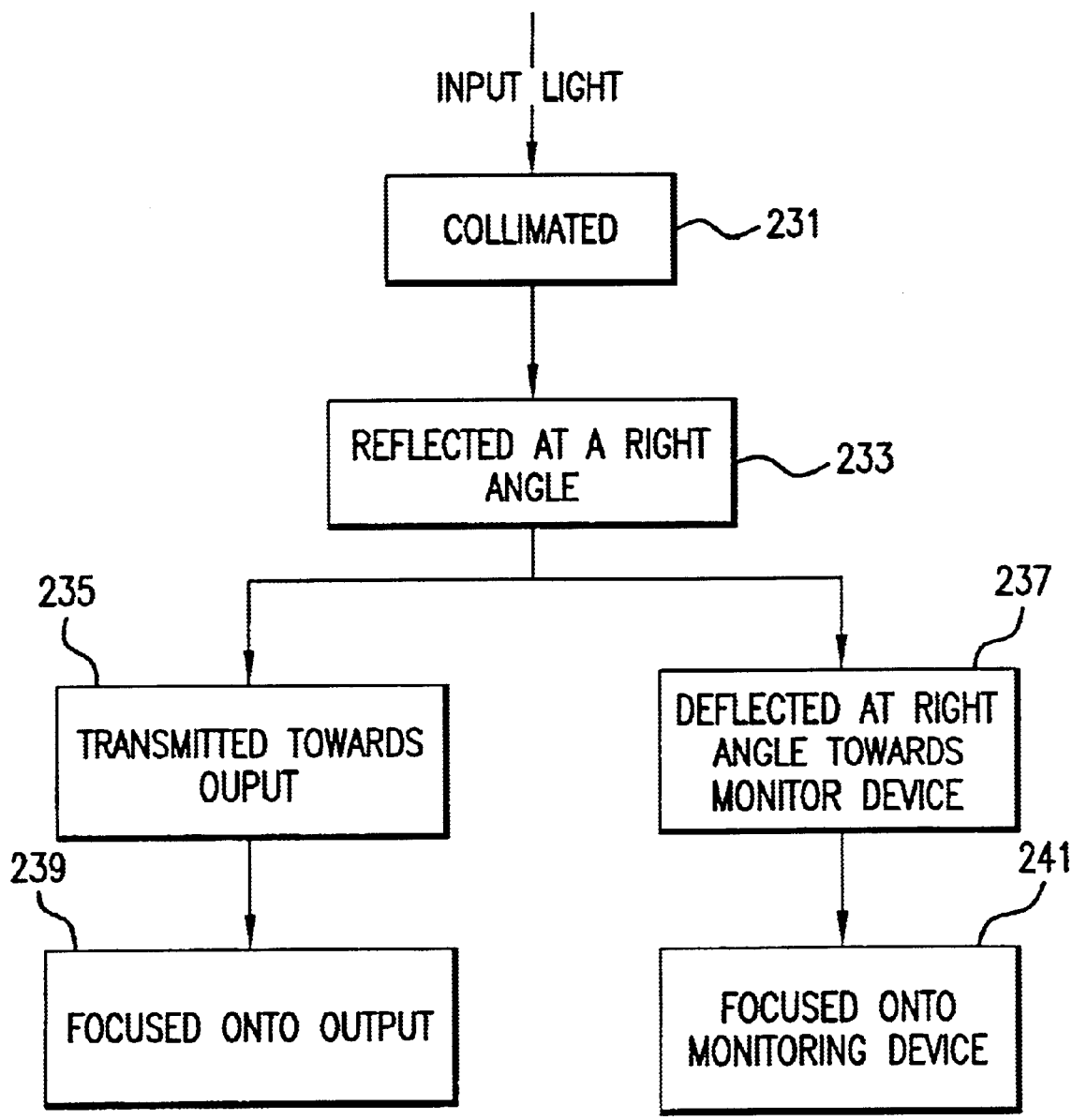
FIG. 2C is a flowchart describing the present invention.

FIG. 2C is a flowchart describing how light entering the present invention is processed. First, in step 231, input light is collimated. Then in step 233, the light is reflected at a right angle. Next, the light is split so that a portion of the light is transmitted towards an output in step 235, and a portion of the light is deflected at a right angle towards a monitoring device in step 237. In step 239, the light that was transmitted towards the output is focused onto the output. In step 241, the light that was deflected towards the monitoring device is focused onto the monitoring device.

Figure 3:
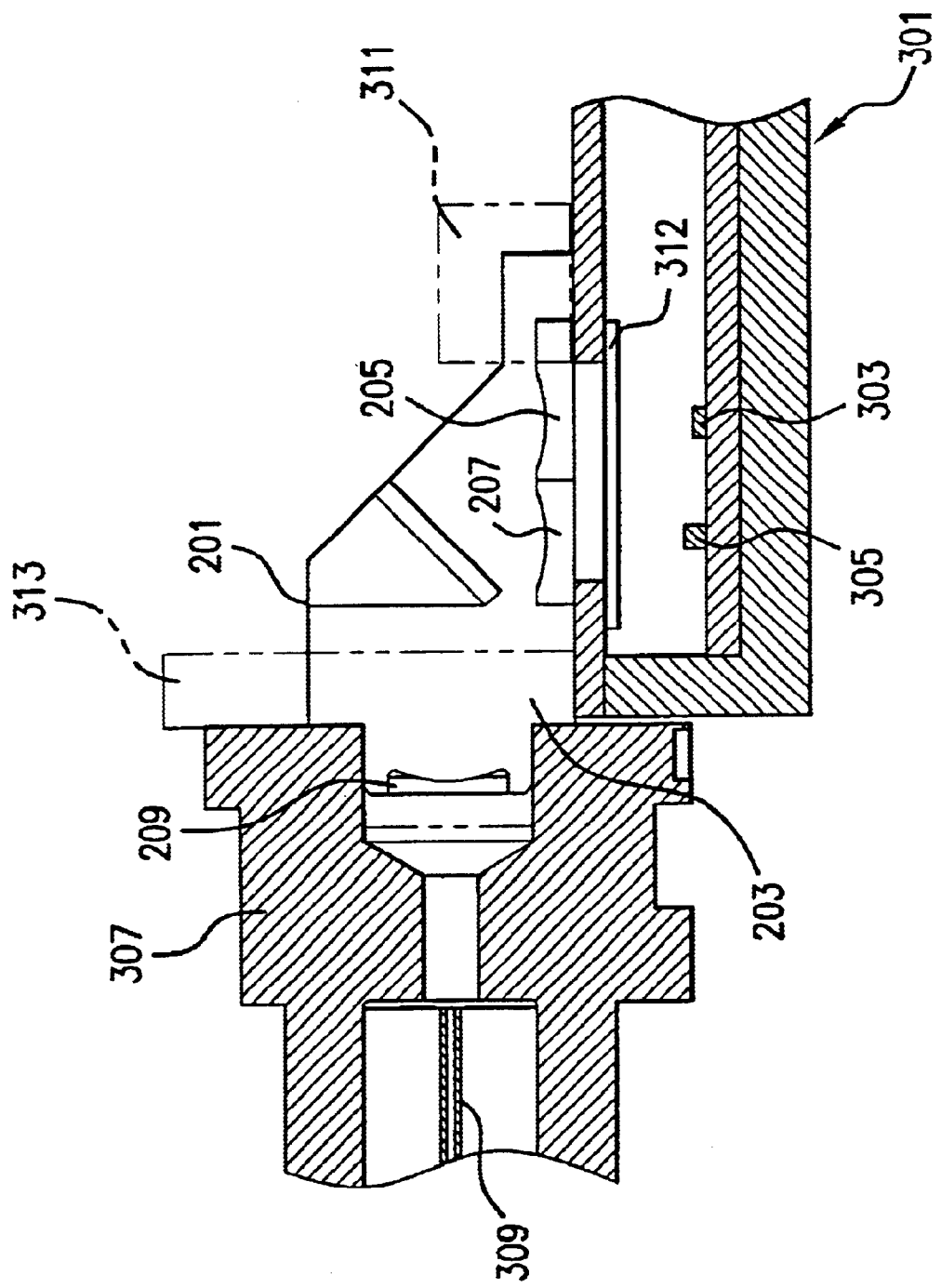
FIG. 3 is a cross-sectional view of an optical turn, shown as a component in an exemplary arrangement. Again, the customary cross-sectional indicators of transparent material have been left out to maintain clarity in the figure.

FIG. 3 illustrates the optical turn 201 as a component in an exemplary system. The optical turn 201 is fastened by any well-known means (e.g. glue or other adhesive) to a package 301 that contains a light source 303 and light monitor 305. The package 301 may be hermetically sealed by a window 312 to improve reliability of the light source 303 and light monitor 305. The optical turn 201 is oriented to the package 301 such that the input lens 205 is lined up with the light source 303 and, and the monitor lens 207 is lined up with the light monitor 305. In FIG. 3, the light source 303 is a VCSEL and the light monitor 305 is a photodiode. Only the relevant portion of the package 301 is shown.

As long as the light paths illustrated in FIG. 2B are not disturbed, the solid block 203 can be shaped in almost any way to fit a desired application. For instance, in FIG. 3, a portion 313 of the solid block 203 has been shaped to mate with the input port 307 of an optical fiber 309, so that the optical fiber 309 is lined up with the output lens 209. The solid block 203 has also been modified to include a support 311 that provides more surface area for mounting to the package 301. The plane of the light source 303 and light monitor 305 is parallel to the optical fiber 309, which gives the package 301 and optical turn 201 a low profile.

Figure 6:
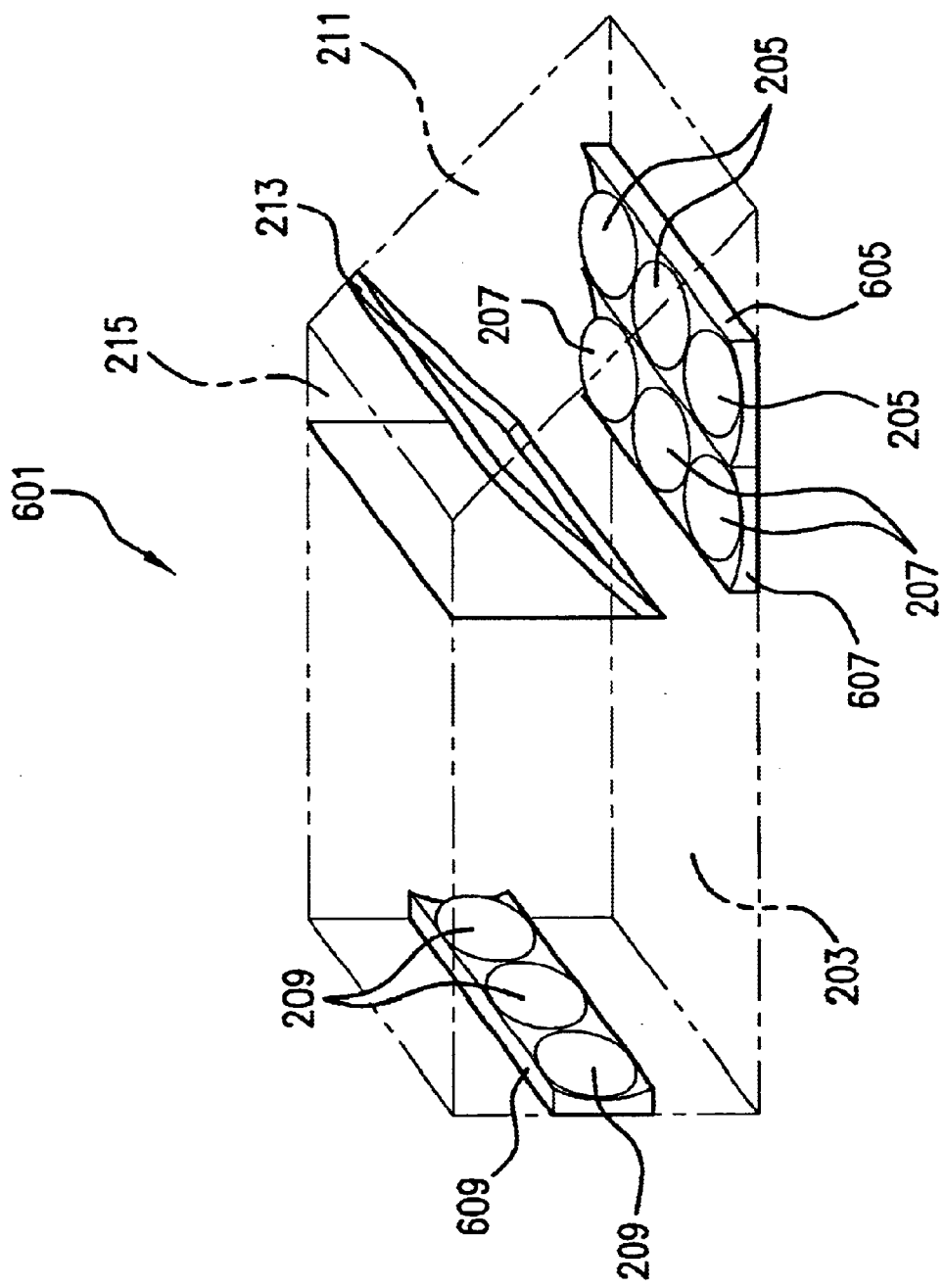
FIG. 6 is a three-dimensional view of an optical turn used in parallel optics to monitor a light array.

In an alternate embodiment for parallel optics, the optical turn 201 of FIG. 2A can be modified to monitor light from an array of light sources, such as N VCSELS lined up in a row. A row of N VCSELS produces a light array having N light beams. FIG. 6 shows a three-dimensional view of an optical turn 601 used to monitor a light array having N light beams. The optical turn 601 is almost identical to the optical turn 201 of FIG. 2A. The input lens 205 of FIG. 2A corresponds to an input lens array 605 with N input lenses 205 in FIG. 6. The monitor lens 207 of FIG. 2A corresponds to a monitor lens array 607 with M monitor lenses 207 in FIG. 6. And the output lens 209 of FIG. 2A corresponds to an output lens array 609 with P output lenses 209 in FIG. 6. As shown in FIG. 6, N=M=P=3, but N, M, and P can be any number greater than or equal to 1. Furthermore, it is not necessary for N, M, and P to equal each other. The TIR surface 211 and the window-mirror 213 are positioned as described in FIG. 2A. The window-mirror 213 can be inserted into a pre-formed notch in the solid block 203 and then glued into place with a plug 215. Alternatively, the window-mirror can be slipped into a pre-formed slot within the solid block 203. The optical turn 601 can also be implemented by stacking multiple optical turns 201 side by side.

Figure 4:
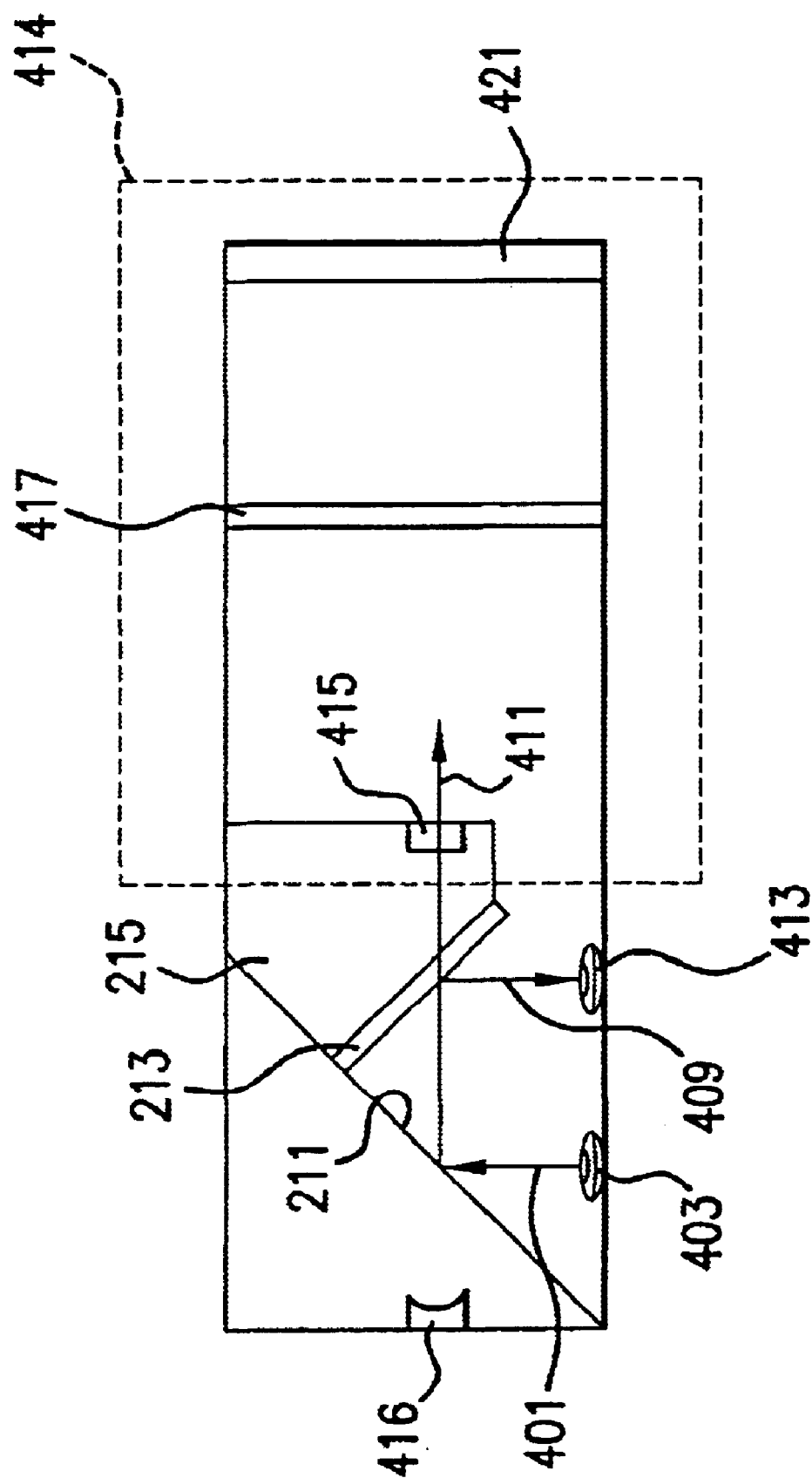
FIG. 4 is a side view of an alternate embodiment of an optical turn for carrying out CWDM.

FIG. 4 shows a side view of another embodiment wherein the optical turn 601 of FIG. 6 has been modified to perform CWDM by sending an array of light through a zigzag multiplexer 414 prior to the output lens array 609. As defined earlier, CWDM combines several different wavelengths of light together into a single beam. An incoming light beam array 401 enters and is collimated through a canted input lens array 403, reflects off of the TIR surface 211, and continues to the window-mirror 213, where it is partially reflected as a monitored light array 409, and partially transmitted as a transmitted light array 411. The monitored light array 409 continues through a monitor lens array 413, where it is focused onto a monitoring device such as a photodiode array. There are N input lenses in the canted input lens array 403, M monitor lenses in the monitor lens array 413, and a single output lens 416. N and M can be any number greater than or equal to 1. Since FIG. 4 is a side view, only the first element in any given array can be seen.

The transmitted light array 411 travels through a zigzag multiplexer 414, a structure well known in the art, before exiting through an output lens 416. The path traveled by the transmitted light array 411 is described in greater detail in the next paragraph. The zigzag multiplexer 414 comprises a filter array 415, a first mirror 417, and a second mirror 421. The filter array 415 is an array of N interference filters such as the ones sold by Optical Coating Laboratory Inc. (OCLI), but only the first filter can be seen since FIG. 4 is a side view.

Figure 5:
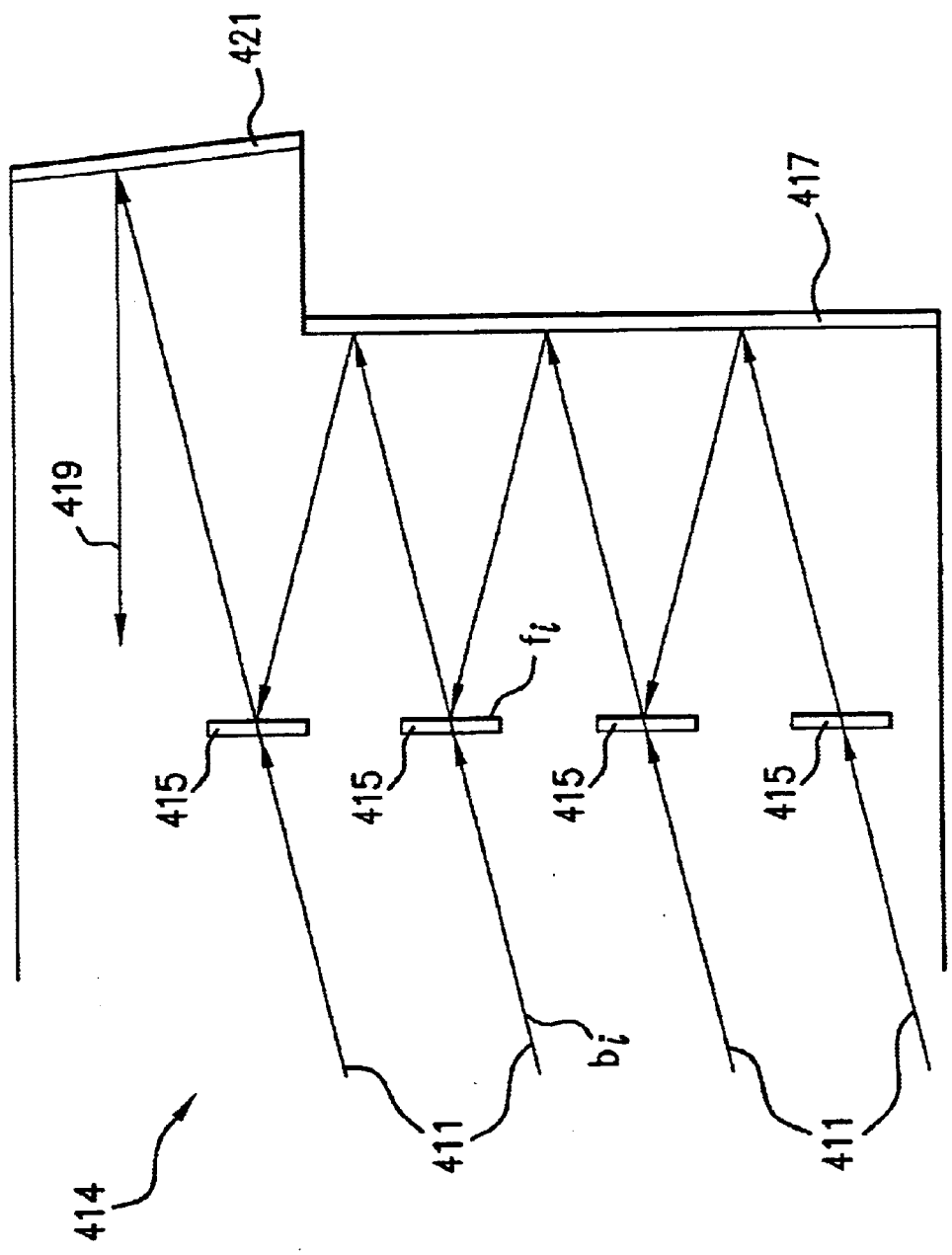
FIG. 5 is a top view of a zigzag multiplexer.

A top-view of the zigzag multiplexer 414 is shown in more detail in FIG. 5. N equals 4 in this illustration, but N can equal any number greater than 1. Since a zigzag multiplexer 414 is well known in the art, it is described here only in brief. The transmitted light array 411 consists of incoming beams, each with a unique reference number $b_i$. Each incoming beam $b_i$ passes through a respective filter $f_i$ in the filter array 415. If a filter were a mathematical function, each filtered beam can be expressed as $f_i(b_i)$. Each filtered beam $f_i(b_i)$ zigzags back and forth, reflecting and bouncing between the first mirror 417 and each subsequent filter, until an outgoing beam 419 is the summation of all filtered beams, described in the following mathematical expression:

$$\text{Outgoing Beam } 419 = \sum_{i=1}^{i=N} f_i(b_i)$$

By picking appropriate filters for the filter array 415, the outgoing beam 419 can be any combination of light wavelengths.

The outgoing beam 419 is reflected off of a second mirror 421 towards the output lens 416 (not shown), where it is focused onto a desired location. The second mirror 421 is angled to reflect the final outgoing beam in a desired direction. In an alternate embodiment, the second mirror 421 is omitted and the outgoing beam 419 travels to the output lens 416 directly from the $N^{th}$ filter.

The filter array 415 is attached to the plug 215 (shown in FIG. 4) such that when the plug 215 is inserted into the notch in the solid block 203, the filter array 415 is lined up in the path of the transmitted light array 411. Alternatively, the filter array 415 can be slipped into a pre-formed slot in the solid block 203. The first mirror 417 and second mirror 421 are glued to the solid block 203. Those skilled in the art will know how to calculate the correct angle of the canted input lens array 403 so that the zigzag multiplexer 414 will work correctly to combine the beams of the transmitted light array 411 into one outgoing beam 419.

Figure 7:
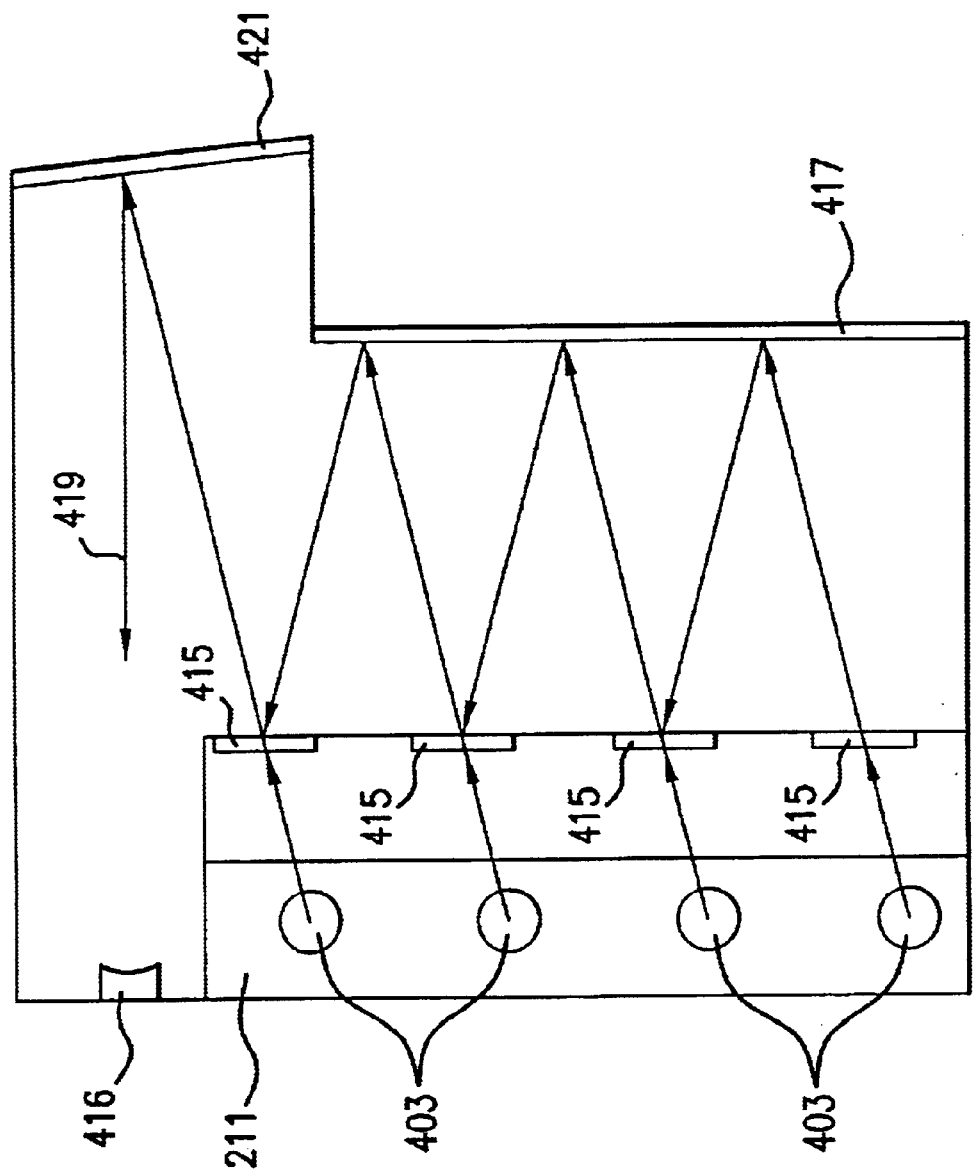
FIG. 7 is a top view of the optical turn shown in FIG. 4. For the sake of clarity, the window-mirror and the monitor lens array are not shown.

FIG. 7 is a top view of the optical turn shown in FIG. 4. For the sake of clarity, the window-mirror and the monitor lens array are not shown in this figure. This figure is an overall illustration of how an incoming light array enters through the canted input lens array 403, reflects off of the TIR surface 211, transmits through the window-mirror 213 (not shown), continues through the filters 415 of the zigzag multiplexer 414 and bounces off the first mirror 417, until the final outgoing beam 419 is formed and reflected off of the second mirror 421 towards the output lens 416.

Figure 8:
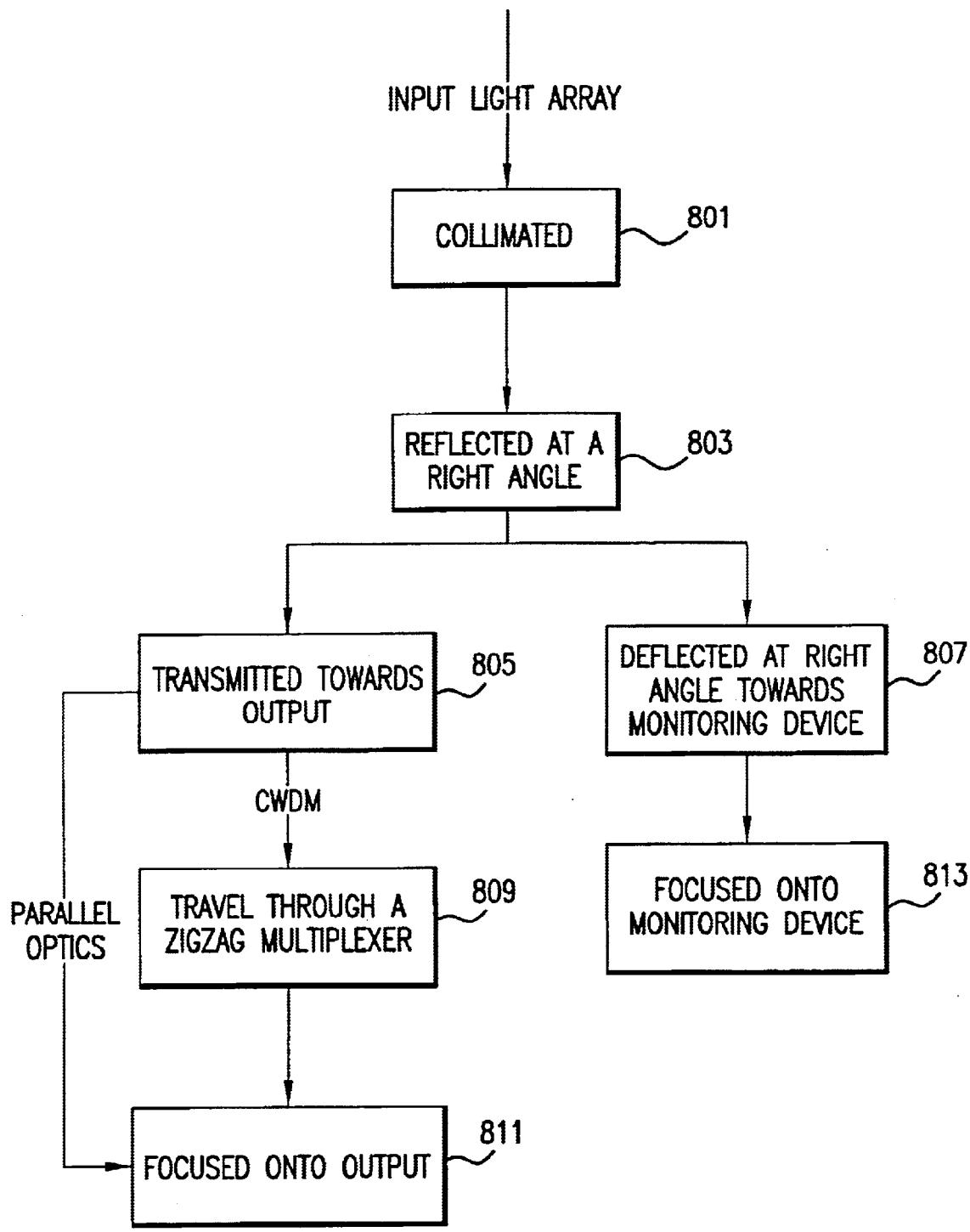
FIG. 8 is a flowchart describing alternate embodiments of the present invention.

FIG. 8 is a flowchart describing the method of parallel optics and CWDM embodiments. First, in step 801, an input light array is collimated. Then in step 803, the light array is reflected at a right angle. Next, each beam in the light array is split so that a portion of the light array is transmitted towards an output in step 805, and a portion of the light array is deflected at a right angle towards a monitoring device in step 807. Step 809 follows step 805 in a CWDM embodiment of the present invention. In an optical monitor that performs CWDM, the light array travels through a zigzag multiplexer prior to reaching the output. In a parallel optics embodiment of the present invention, step 809 is skipped after step 805. Instead, the light that was transmitted towards the output is focused onto the output in step 811. In both CWDM and parallel optics embodiments, the light array that was deflected towards the monitoring device is focused onto the monitoring device in step 813.

Although the present invention has been described in detail with reference to particular preferred embodiments, persons possessing ordinary skill in the art to which this invention pertains will appreciate that various modifications and enhancements may be made without departing from the spirit and scope of the claims that follow.

I claim:

1. An optical turn for redirecting an incoming light array having N light beams, with N≧1 comprising:

an input lens array having N input lenses that collimate the incoming light array into a collimated light array, with N≧1, each lens in the input lens array having an optical axis;

a reflective surface positioned at a first angle to an optical axis of a lens in the input lens array;

a monitor lens array having M monitor lenses, with M≧1;

an output lens array having P output lenses, with P≧1; and a window-mirror interposing the reflective surface and the output lens array, at a second angle to an optical axis of a lens in the monitor lens array;

wherein the collimated light array reflects off of the reflective surface onto the window-mirror, where it is partially transmitted to the output lens array, and partially reflected to the monitor lens array.

2. The optical turn as in claim 1, wherein the light array partially reflected from the window-mirror can be monitored with a monitor/driver IC.

3. The optical turn as in claim 2, wherein the first angle is about 45 degrees.

4. The optical turn as in claim 3, wherein the second angle is about 45 degrees.

5. The optical turn as in claim 4, wherein N=M=P.

6. The optical turn as in claim 5, wherein N=M=P=1.

7. The optical turn as in claim 4, wherein:

the output lens array has P=1; and the light array partially transmitted from the window-mirror passes through a zigzag multiplexer prior to reaching the output lens array.

8. An optical turn for redirecting an incoming light array having N light beams, with N≧1, comprising:

an optically transmissive block;

an input lens array having N input lenses in the optically transmissive block that collimates the incoming light army into a collimated light array, with N≧1, each lens in the input lens array having an optical axis;

a totally internally reflecting surface of the optically transmissive block, positioned at a first angle to an optical axis of a lens in the input lens array;

a monitor lens array having M monitor lenses in the optically transmissive block, with M≧1;

an output lens may having P output lenses in the optically transmissive block, with P≧1; and a window-mirror in the optically transmissive block, interposing the totally internally reflecting surface and the output lens array, at a second angle to an optical axis of a lens in the monitor lens array;

wherein the collimated light array reflects off of the totally internally reflecting surface onto the window-mirror, where it is partially transmitted to the output lens array, and partially reflected to the monitor lens array.

9. The optical turn as in claim 8, wherein the collimated light array is parallel to the partially reflected light array from the window-mirror.

10. The optical turn as in claim 9, wherein the first angle is about 45 degrees.

11. The optical turn as in claim 10, wherein the second angle is about 45 degrees.

12. The optical turn as in claim 11, wherein the input lens array, monitor lens array, output lens array, optically transmissive block, and window-mirror have similar indices of refraction.

13. The optical turn as in claim 12, wherein the input lens array, output lens array, and monitor lens array are formed from the same material as the optically transmissive block.

14. The optical turn as in claim 13, wherein N=M=P.

15. The optical turn as in claim 14, wherein N=M=P=1.

16. The optical turn as in claim 13, wherein:

the output lens array has P=1; and the transmitted light array passes through a zigzag multiplexer prior to reaching the output lens array, the zigzag multiplexer comprising:

an array of interference filters that filters the transmitted light array;

a first mirror which reflects light coming through the array of interference filters, bouncing the light between the array of interference filters and the first mirror, to create a final outgoing beam; and a second mirror which reflects the final outgoing beam towards the output lens array.

17. The optical turn as in claim 16, wherein:

each interference filter in the array of interference filters of the zigzag multiplexer passes light of a different wavelength.

18. A method for redirecting a light array having N light beams, with N≧1, comprising the steps of:

collimating each light beam in the light array to create a collimated light array;

reflecting the collimated light array at a right angle as a reflected light array;

partially transmitting the reflected light array as a transmitted light array;

partially deflecting the reflected light array at a right angle as a monitored light array directly towards a light monitoring device;

focusing the monitored light array onto the light monitoring device; and focusing the transmitted light array onto an array of fiber-optic cables.

19. The method of claim 18, wherein the monitored light array can be monitored with a monitor/driver IC.

20. The method of claim 19, further comprising the step of sending the transmitted light array through a zigzag multiplexer, prior to the step of focusing the transmitted light array.

21. The method of claim 18, wherein the steps of collimating, reflecting, partially transmitting, partially deflecting, focusing the monitored light array, and focusing the transmitted light array, occur within an optically transmissive moldable plastic block.

22. The method of claim 21, wherein the monitored light array can be monitored with a monitor/driver IC.

23. The method of claim 22, further comprising the step of sending the transmitted light array through a zigzag multiplexer, prior to the step of focusing the transmitted light array.

* * * * *